United States Patent
Foegelle

(10) Patent No.: US 8,326,229 B2
(45) Date of Patent: Dec. 4, 2012

(54) SYSTEMS AND METHODS FOR OVER-THE-AIR TESTING OF WIRELESS SYSTEMS

(75) Inventor: Michael Foegelle, Cedar Park, TX (US)

(73) Assignee: ETS Lindgren, L.P., Cedar Park, TX (US)

( * ) Notice: Subject to any disclaimer, the term of this patent is extended or adjusted under 35 U.S.C. 154(b) by 439 days.

(21) Appl. No.: 12/731,906

(22) Filed: Mar. 25, 2010

(65) Prior Publication Data

US 2010/0216409 A1    Aug. 26, 2010

Related U.S. Application Data

(63) Continuation of application No. 11/810,965, filed on Jun. 7, 2007, now Pat. No. 7,965,986.

(60) Provisional application No. 60/811,679, filed on Jun. 7, 2006.

(51) Int. Cl.
*H04B 17/00* (2006.01)

(52) U.S. Cl. ............... 455/67.11; 455/67.14; 455/67.16; 455/115.1; 455/226.1; 324/637; 324/639; 324/633; 324/627

(58) Field of Classification Search .......... 455/67.11, 455/67.14, 67.16, 115.1, 115.2, 226.1, 226.2, 455/226.3; 324/637, 639, 633, 627, 663, 324/613, 636, 202, 204, 224, 261, 262

See application file for complete search history.

(56) References Cited

U.S. PATENT DOCUMENTS

| | | | |
|---|---|---|---|
| 5,530,412 A * | 6/1996 | Goldblum | 333/232 |
| 5,794,128 A | 8/1998 | Brockel et al. | |
| 6,308,072 B1 | 10/2001 | Labedz et al. | |
| 6,563,327 B1 * | 5/2003 | Leferink | 324/637 |
| 6,571,082 B1 | 5/2003 | Rahman et al. | |
| 6,687,650 B2 | 2/2004 | Hatanaka et al. | |
| 7,286,802 B2 | 10/2007 | Beyme et al. | |
| 7,508,868 B2 | 3/2009 | Chang | |
| 2002/0160717 A1 * | 10/2002 | Persson et al. | 455/67.1 |
| 2003/0008620 A1 * | 1/2003 | Rowell et al. | 455/67.1 |
| 2003/0236089 A1 | 12/2003 | Beyme et al. | |
| 2006/0194553 A1 | 8/2006 | Ozaki et al. | |

* cited by examiner

*Primary Examiner* — Tuan Pham

(74) *Attorney, Agent, or Firm* — Christopher & Weisberg, P.A.

(57) ABSTRACT

Embodiments include systems and methods for over-the-air testing of wireless systems. Embodiments comprise separated anechoic chambers containing wireless devices. The anechoic chambers are connected by propagation path corridors.

19 Claims, 19 Drawing Sheets

SYSTEMS AND METHODS FOR OVER-THE-AIR TESTING OF WIRELESS SYSTEMS

PRIORITY

This application is a continuation of, and claims priority of, U.S. patent application Ser. No. 11/810,965, filed Jun. 7, 2007 now U.S. Pat. No. 7,965,968, which is incorporated herein by reference in its entirety, and which is a non-provisional application that claims priority of provisional U.S. Patent Application Ser. No. 60/811,679, filed Jun. 7, 2006.

FIELD

Embodiments are in the field of wireless communications. More particularly, embodiments are in the field of over-the-air testing of wireless systems.

BRIEF DESCRIPTION OF THE DRAWINGS

Aspects of the invention will become apparent upon reading the following detailed description and upon reference to the accompanying drawings in which like references may indicate similar elements.

DETAILED DESCRIPTION OF EMBODIMENTS

The following is a detailed description of embodiments depicted in the accompanying drawings. The embodiment(s) presented herein are merely illustrative, and are not intended to limit the anticipated variations of such embodiments; on the contrary, the intention is to cover all modifications, equivalents, and alternatives falling within the scope of the appended claims. The detailed descriptions below are designed to make such embodiments obvious to those of ordinary skill in the art.

Embodiments include systems and methods for over-the-air testing of wireless systems. Some embodiments comprise separated anechoic chambers containing wireless devices. The anechoic chambers are connected by propagation path corridors which provide multiple paths of different path lengths.

Multiple Input Multiple Output (MIMO) operation of devices compliant with Institute of Electrical and Electronics Engineers (IEEE) standard 802.11n requires a multipath environment to achieve the full benefit of MIMO technology. For best results, a multipath test environment for testing a MIMO system should be: isolated (shielded) from outside interference; repeatable from test to test; reproducible from test lab to test lab; predictable with a standardized level of multipath; and a realistic model of multipath behavior in similar-to-real-world environments. The choice of test environment can have a significant effect on the resulting over-the-air test if all possible modes of operation are to be tested.

Figure 1:
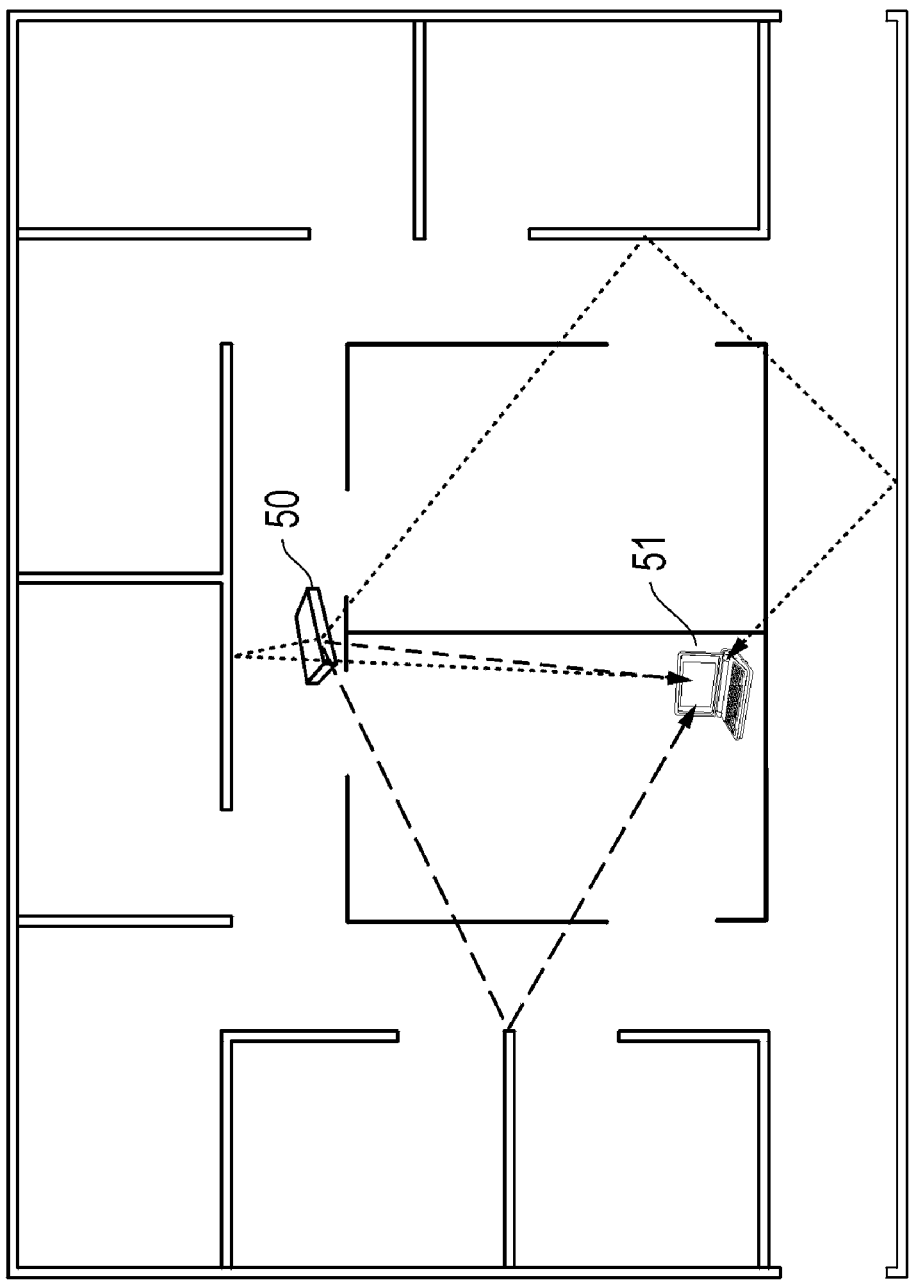
FIG. 1 depicts a typical indoor multipath environment.
Figure 2:
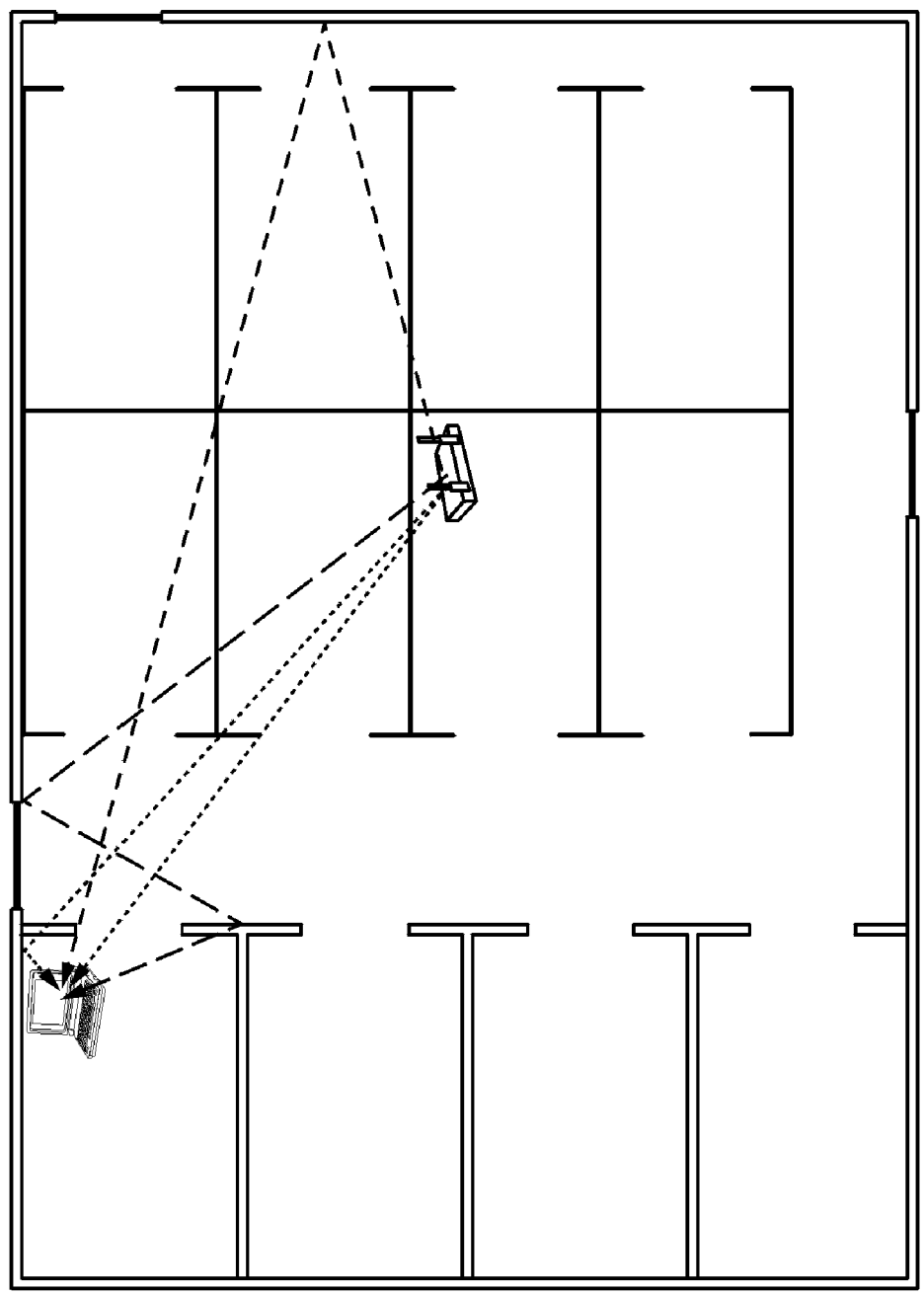
FIG. 2 depicts a typical indoor multipath environment with different test locations.
Figure 3:
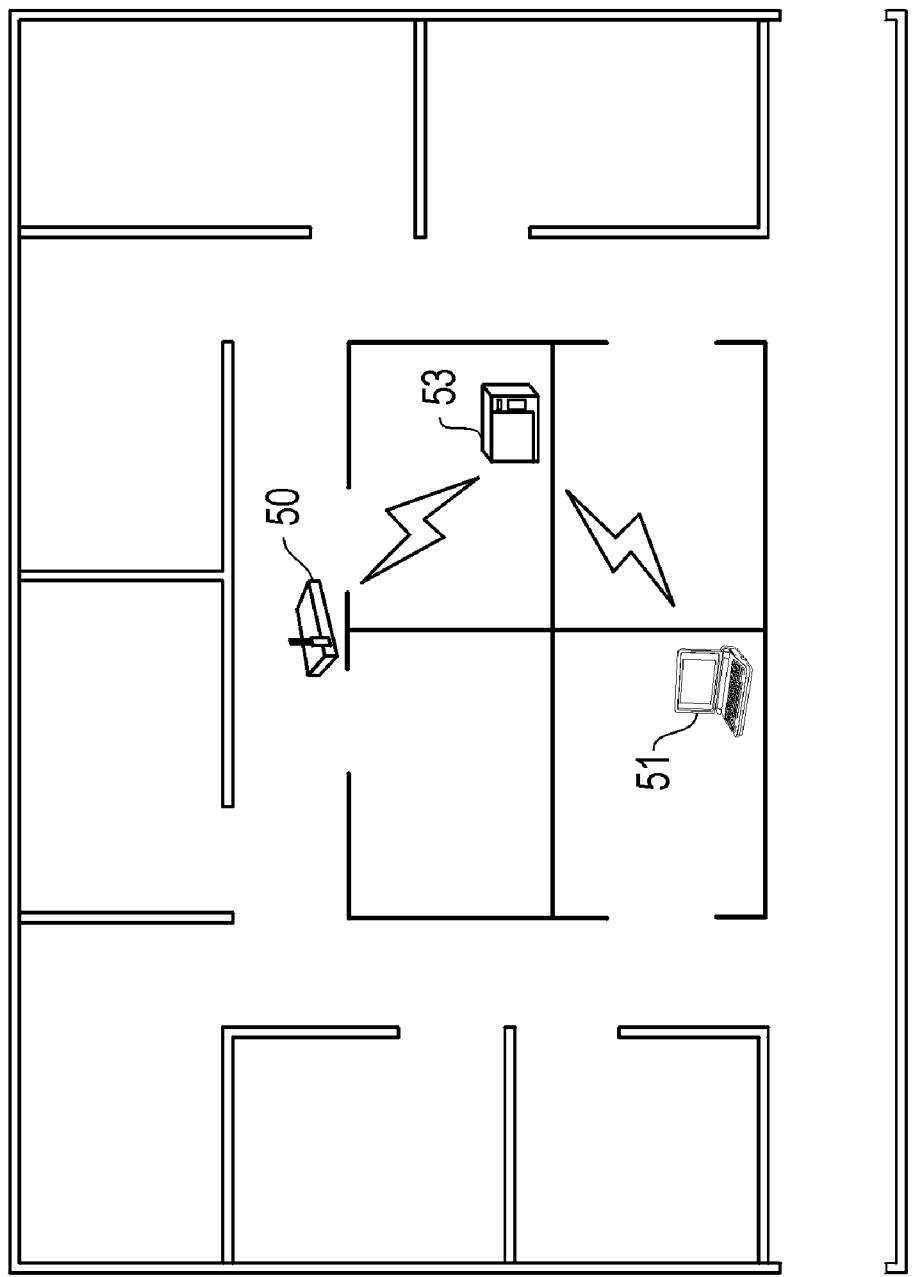
FIG. 3 depicts an indoor multipath environment with extraneous interference.

The 802.11n standard has defined a number of channel models for line of sight (LOS) and non line of sight (NLOS) indoor and outdoor environments. Models include delay spreads of 15, 30, 50, 100, 140, 150 and 250 nano-seconds (ns), corresponding to path lengths of 4.5, 9, 15, 30, 42, 45, and 75 meters (m). Ideally, a MIMO test environment would be able to approximate one or more of these models to test the operation of wireless devices. FIG. 1 shows a transmitting device 50 and a receiving device 51 in a typical indoor multipath environment illustrating possible LOS and NLOS paths. FIG. 2 shows LOS and NLOS paths with different test locations, resulting in different paths. FIG. 3 shows that in a real world environment, the wireless system is also subject to unwanted extraneous interference from equipment 53.

Figure 4:
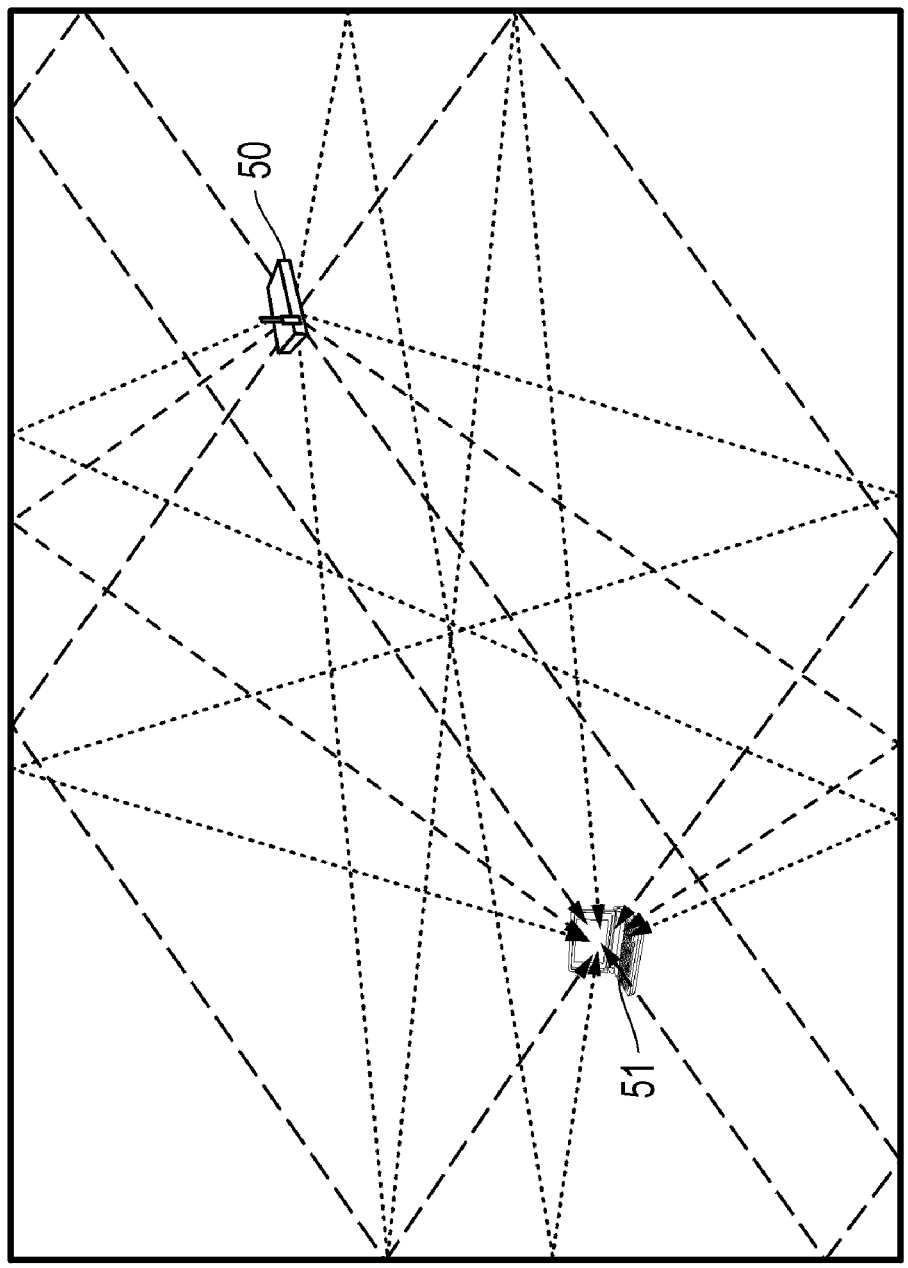
FIG. 4 depicts a shielded room with excessive multipath.
Figure 5:
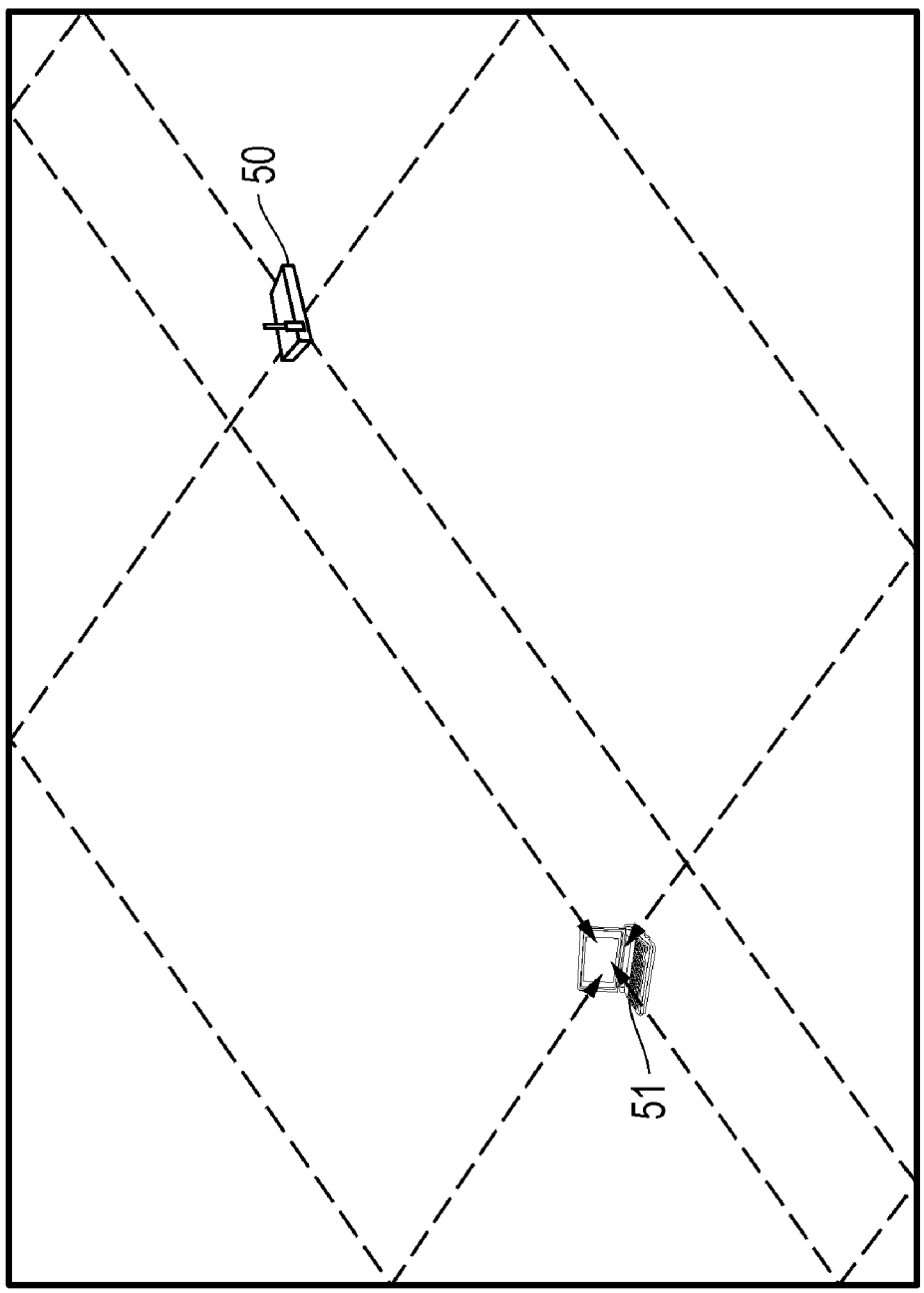
FIG. 5 depicts multiple identical paths in a shielded room.

FIG. 4 shows a result of using a shielded room (screen room) for multipath testing of a wireless system. The metal walls cause excessive multipath propagation, far exceeding a number of paths found in a real world setting. FIG. 5 shows that in a shielded room, symmetry causes multiple identical paths that produce deeper fading than typically found in the real world. Due to symmetry, signals reinforce each other in or out of phase. In a shielded room, energy bounces around until absorbed by other objects in the room or losses in the walls.

Figure 6:
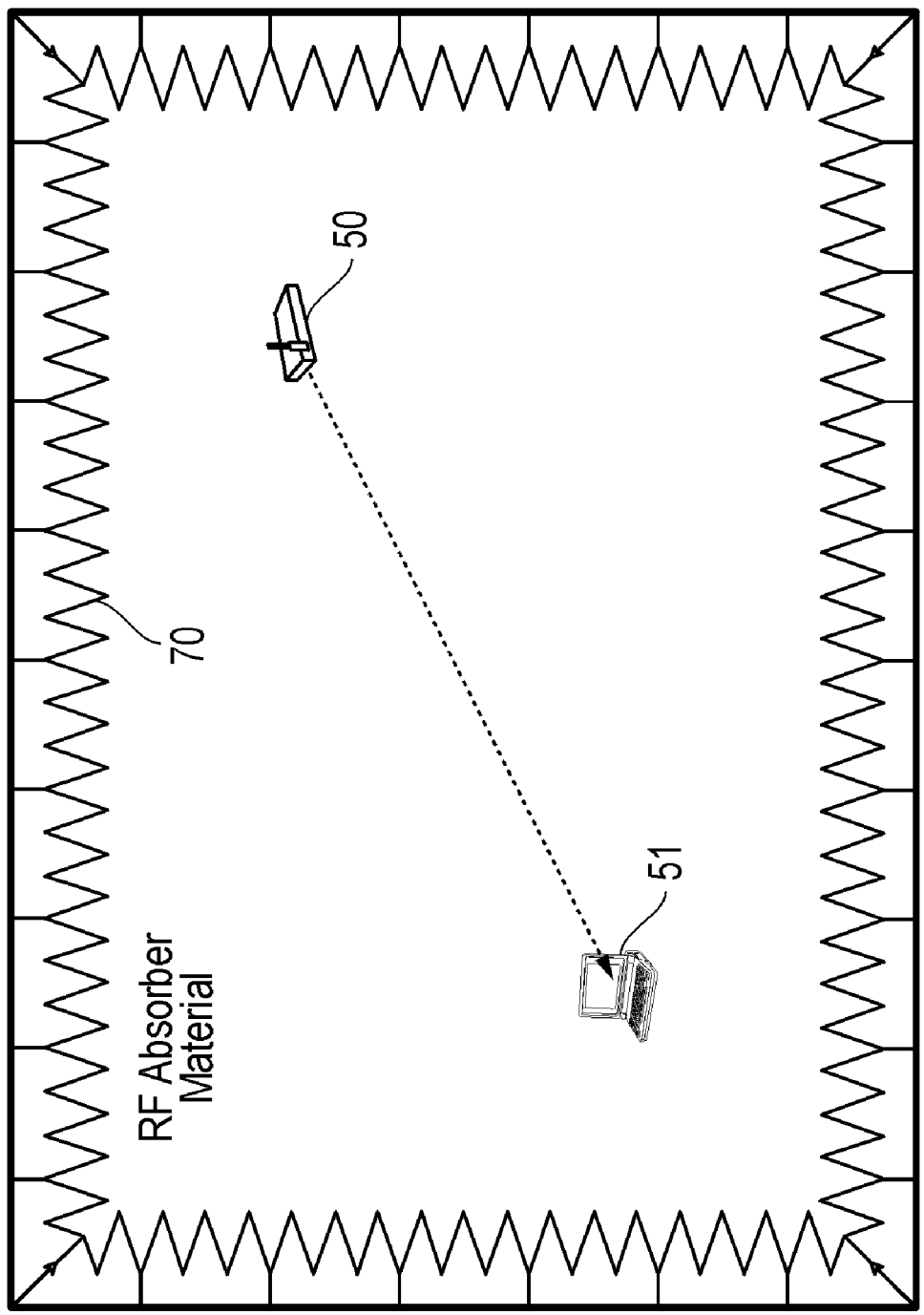
FIG. 6 depicts a fully anechoic chamber.
Figure 7:
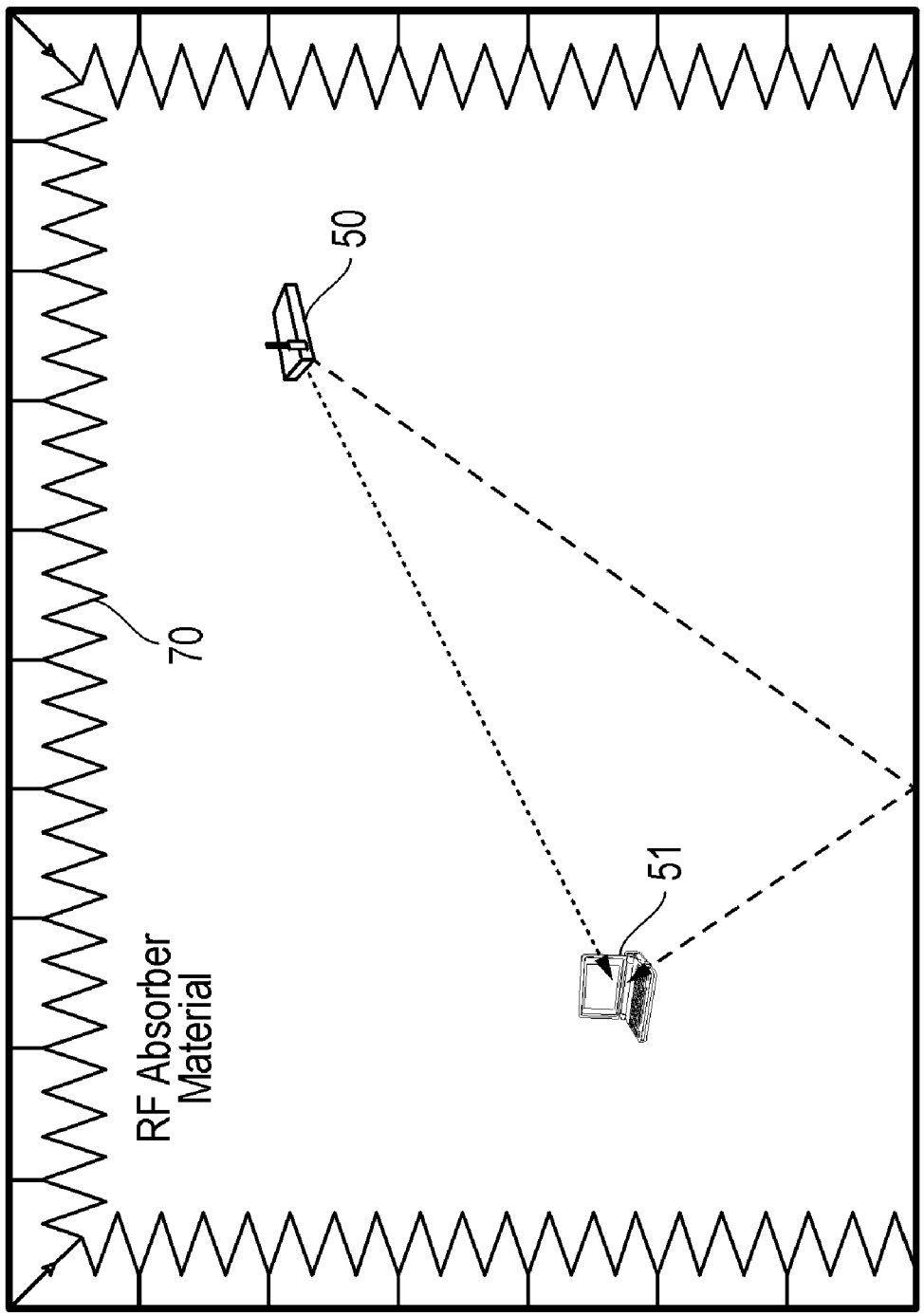
FIG. 7 depicts a semi-anechoic chamber.
Figure 8:
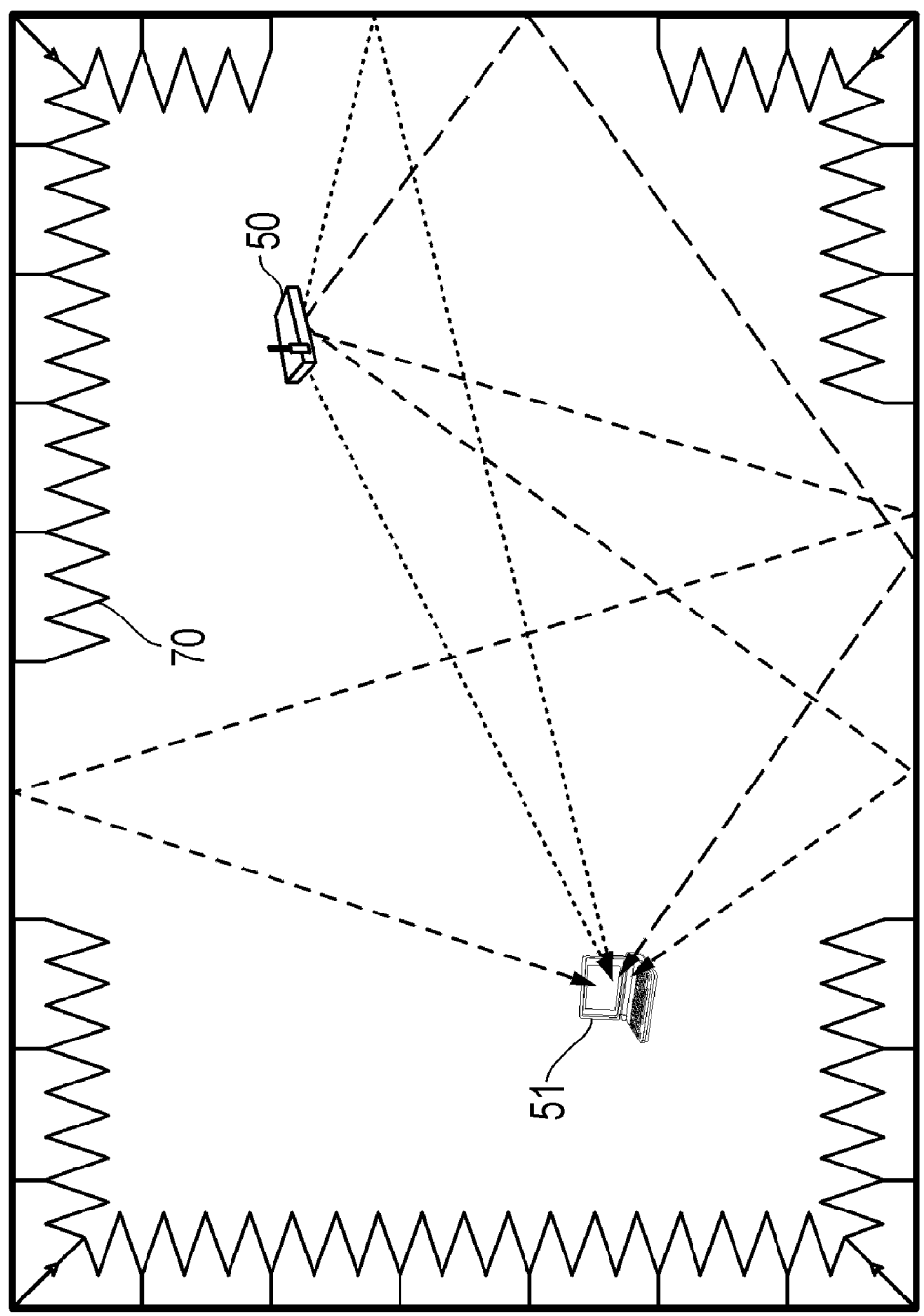
FIG. 8 depicts an anechoic chamber with selectively placed absorbers.

FIG. 6 shows a fully anechoic chamber with all boundaries covered with absorber 70. This is unsuitable for multipath testing between multiple DUTs within that environment since no significant multipath remains, because of absorber 70. FIG. 7 shows a semi-anechoic chamber (usually used for Electromagnetic compatibility (EMC) testing) which leaves the floor of the chamber reflective. In this setup, only one additional path remains, and is thus unsuitable for realistic multipath testing. FIG. 8 shows an anechoic chamber with selective positioning of absorber 70 to choose specific multipaths. The multipaths so selected are dependent upon the position of the bare areas and long path lengths are difficult to achieve.

Figure 9:
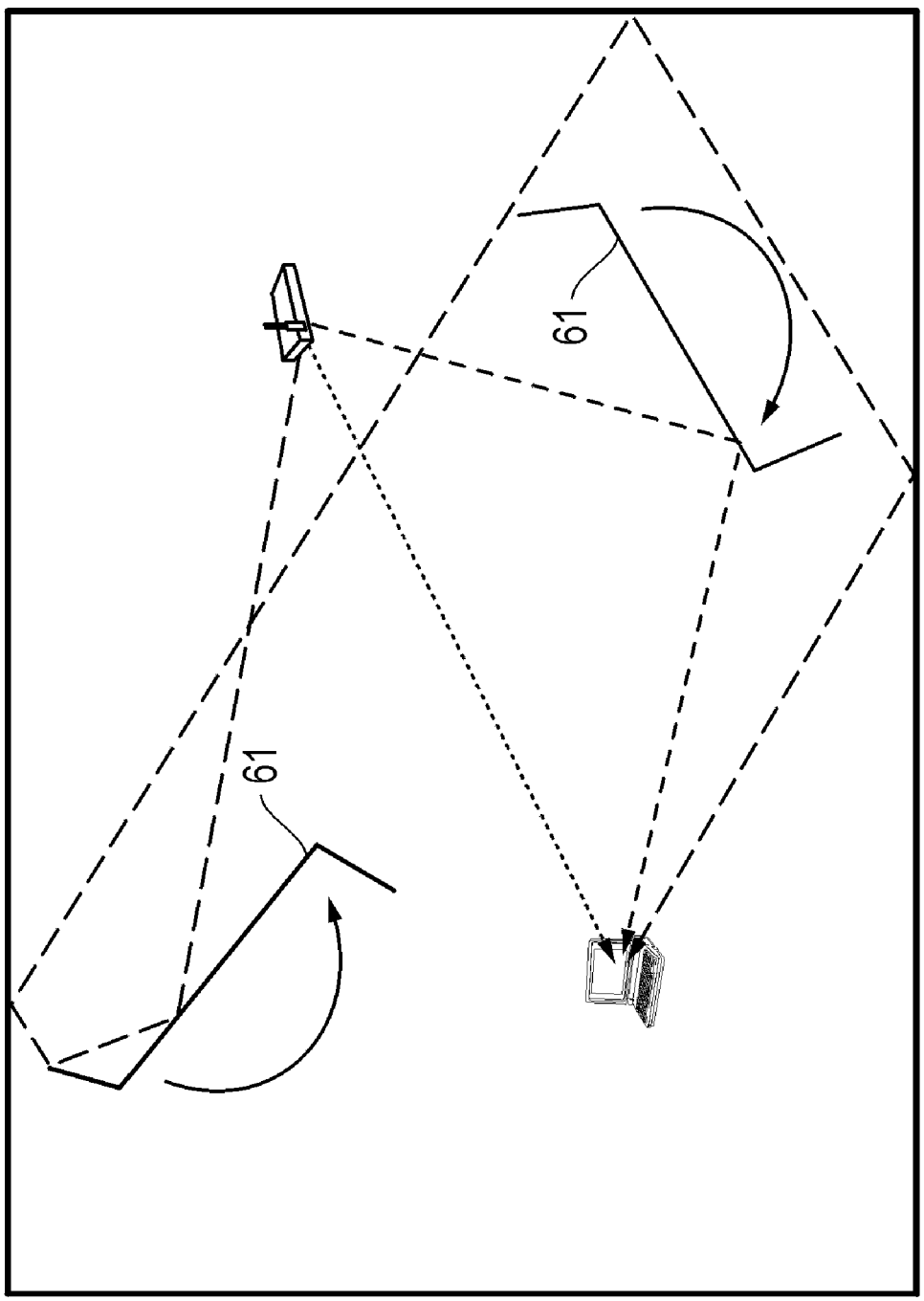
FIG. 9 depicts a high Q shielded room with rotatable paddles (reverberation chamber).

FIG. 9 shows a reverberation chamber comprising rotating paddles 61 in a High Q shielded room. The rotating paddles "stir" field modes for statistical uniformity and result in variable multipath fading.

While several of the solutions described above could potentially be configured to produce the multipath behavior described by the 802.11n channel models, each has its drawbacks. One problem is the overall size required to produce a given path length without creating additional sub-paths. A compact environment that's capable of generating long path length behavior is needed.

Figure 10:
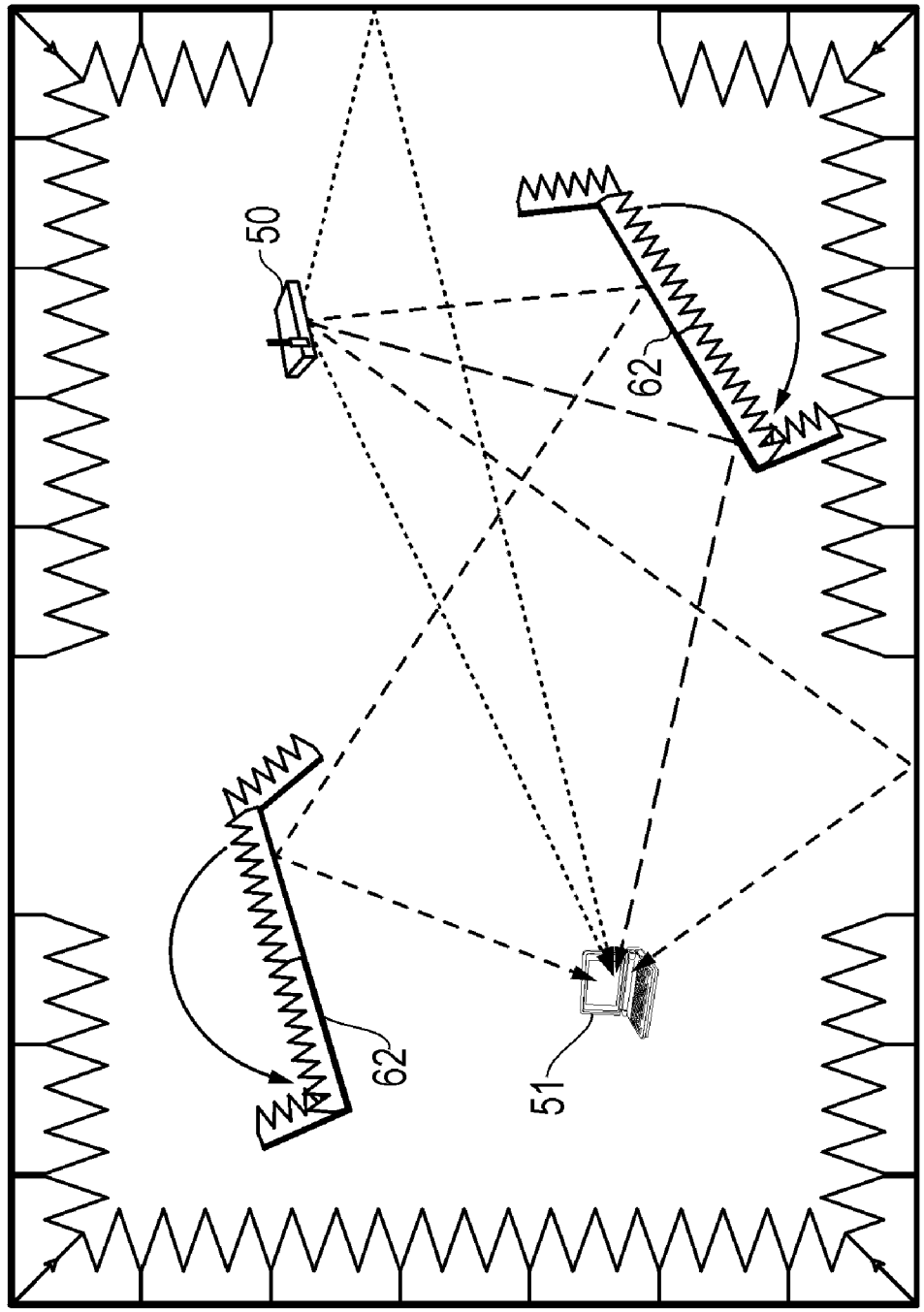
FIG. 10 depicts a hybrid chamber with partially absorbing rotating paddles.
Figure 10A:
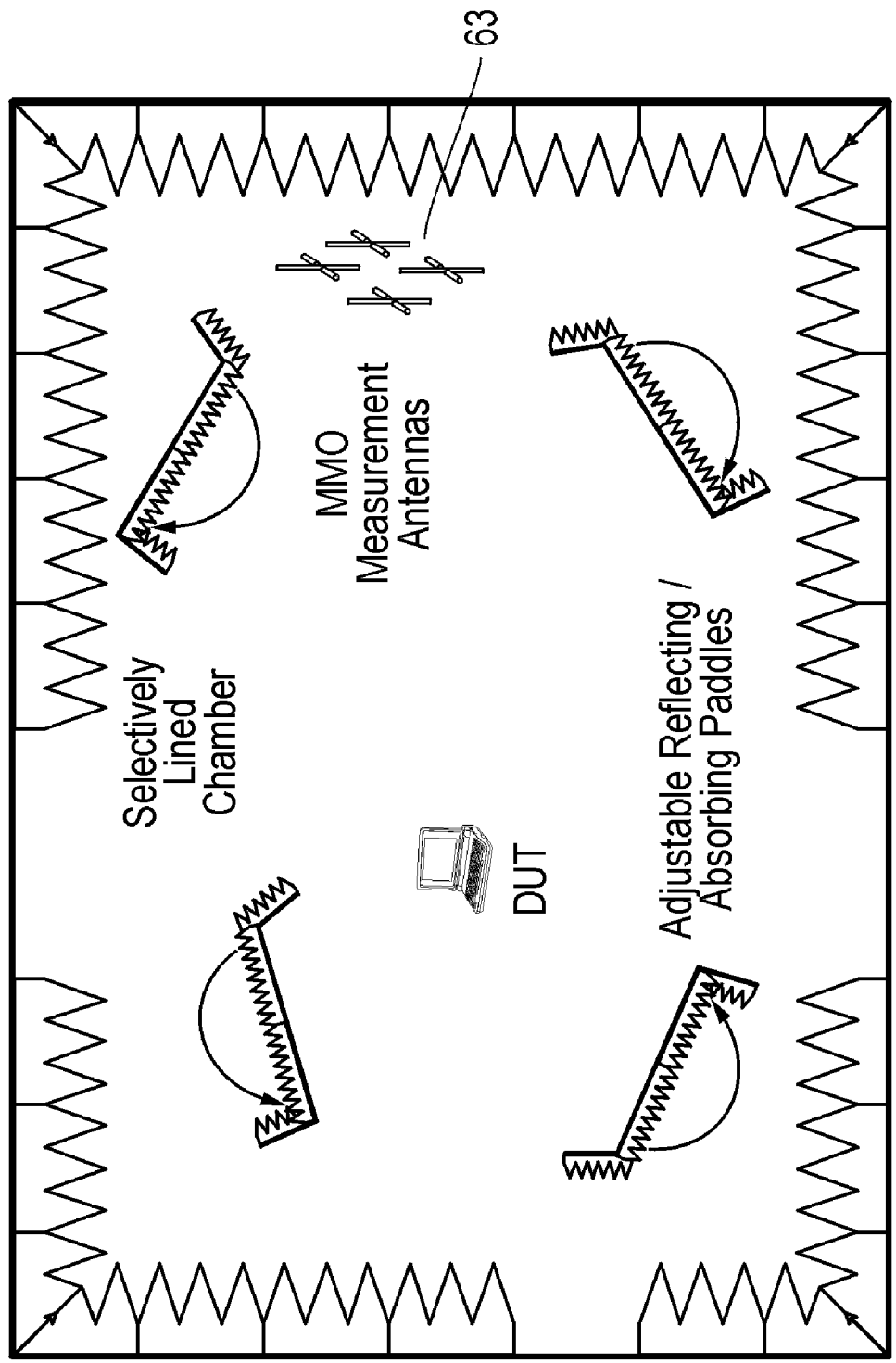
FIG. 10A depicts an alternative view of a selectively-lined reverberation room with MIMO antennas for connection to external test equipment.

FIG. 10 shows a hybrid multipath chamber combining partially absorbing reflecting stir paddles 62 in a partial anechoic chamber. This test setup provides more realistic variable multipath. FIG. 10A shows an alternative view of a selectively lined reverberation chamber with MIMO antennas 63 for connection to external test equipment. The configurations of FIGS. 10 and 10A can be described as low Q or lossy reverberation environments. Extreme multipath (slowly decaying RF signals bouncing from walls and paddles) of these reverberation chamber can be made to look more like the real world by selectively loading the chamber until the desired decay profile is obtained.

Thus, some embodiments comprise an apparatus for over the air testing of wireless devices, comprising a partially absorber-lined anechoic chamber, comprising: at least one wall that is only partially covered by absorbing material. In some embodiments, the apparatus further comprises a separate anechoic chamber connected to the partially lined chamber through a connecting propagation path corridor. In some embodiments, the apparatus further comprises a positionable stir paddle in the chamber. In some embodiments, the apparatus further comprises at least one antenna within the chamber.

Figure 11:
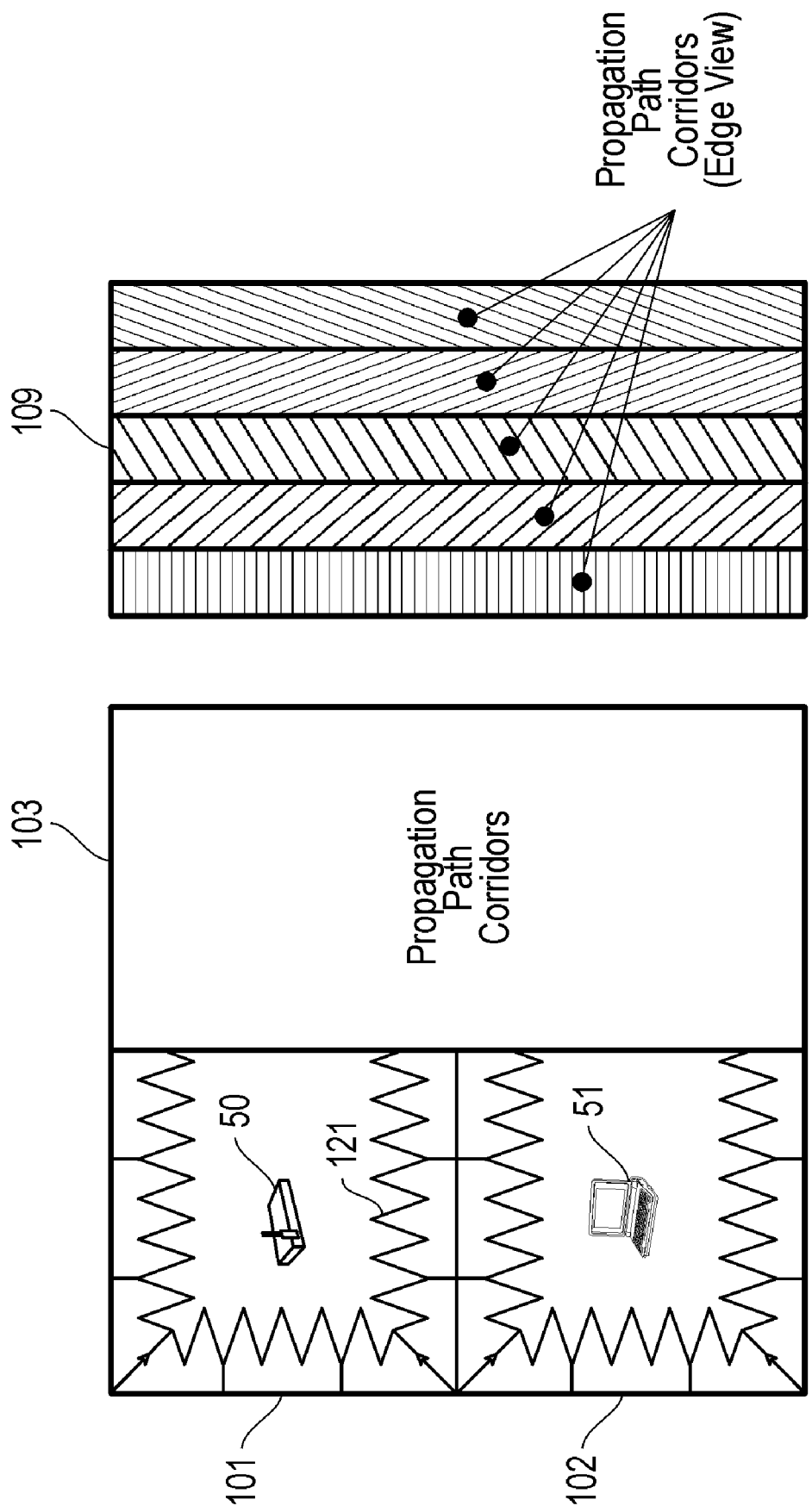
FIG. 11 depicts separate anechoic chambers connected by a plurality of propagation path corridors.
Figure 11A:
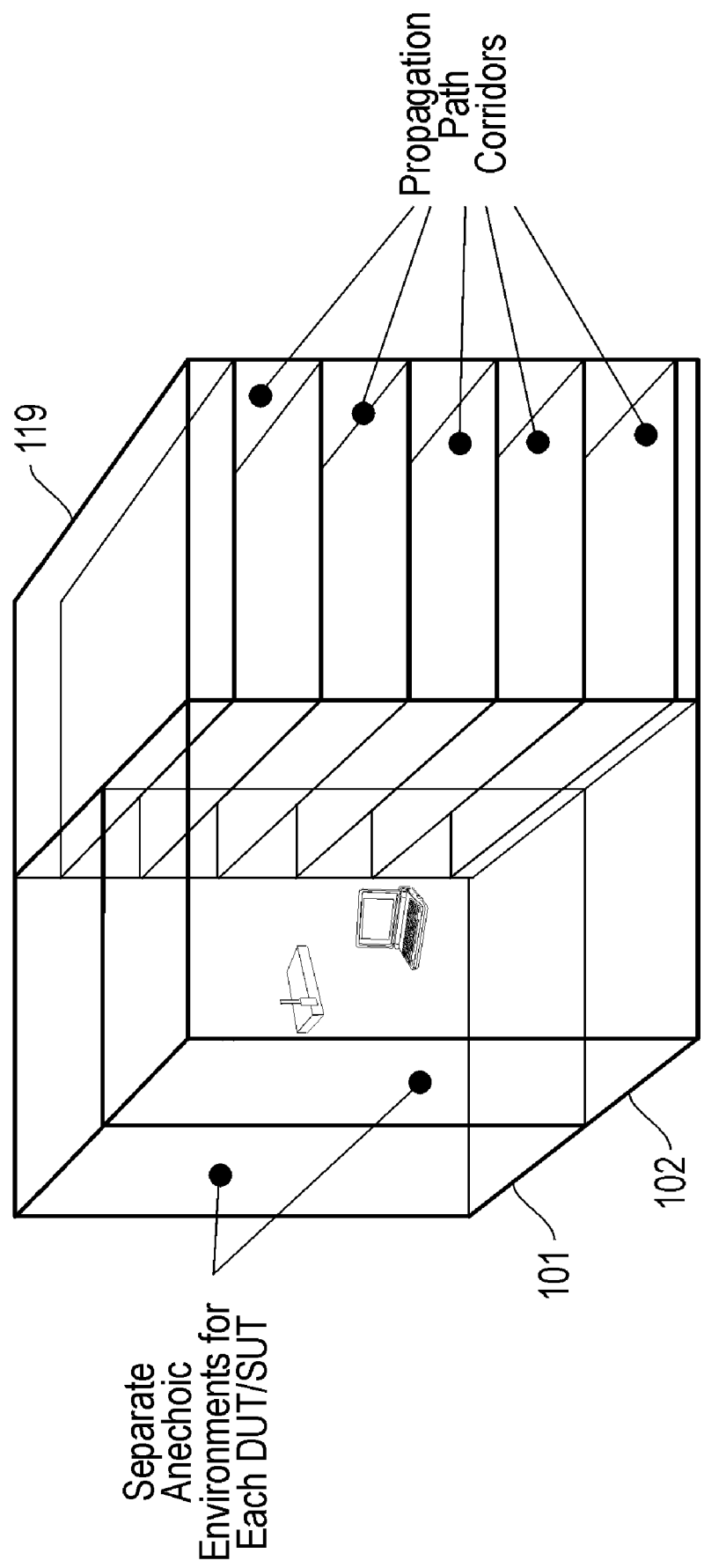
FIG. 11A depicts a perspective view of two separated anechoic chambers connected with parallel propagation path corridors.
Figure 12:
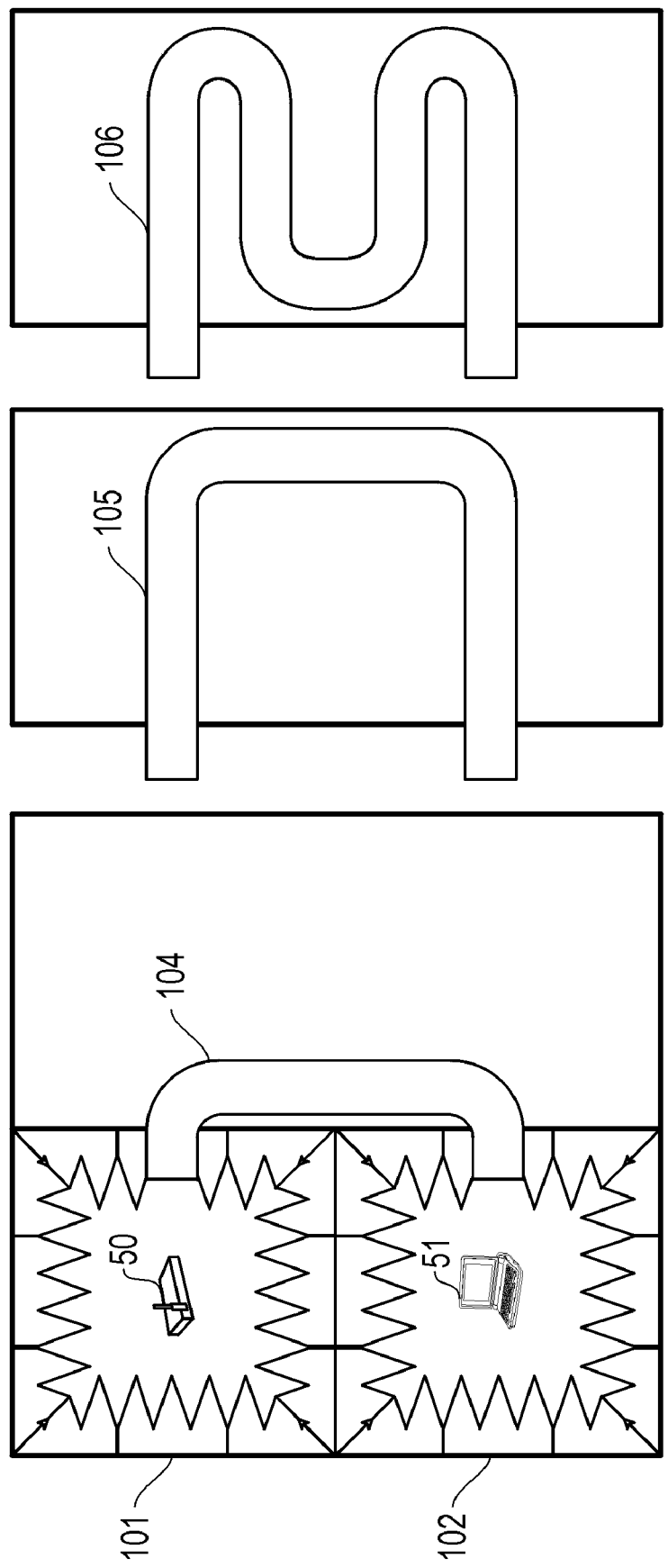
FIG. 12 depicts separate anechoic chambers connected by waveguide sections.

FIG. 11 shows an embodiment that combines separate anechoic chambers 101 and 102 connected by propagation path corridors 103 that provide propagation paths of different lengths. Block 119 shows an edge view indicating how the different propagation corridors can be stacked in parallel to provide multiple propagation paths simultaneously. FIG. 11A shows a perspective view of two separated anechoic chambers 101, 102 connected with the parallel propagation path corridors 119. Note that although a rectangular geometry is shown. Other geometries, such as a circular-cylindrical geometry, may be employed. FIG. 12 shows sample propagation path corridors connecting two separate anechoic chambers 101 and 102. Each exemplary propagation path corridor may be a waveguide of different length. Thus, a first path length is provided by waveguide 104, a second path length is provided by waveguide 105 and a third path length is provided by waveguide 106. These different propagation paths may be stacked or placed in parallel to provide multiple propagation paths simultaneously. Each waveguide may be terminated with a suitable horn antenna to direct the propagation as needed. Branches and shorted stubs can be used to create standing wave reflections of a desired periodicity. Note that instead of waveguide, other propagation mechanisms, such as coaxial cable, can be employed as propagation path corridors.

Figure 13:
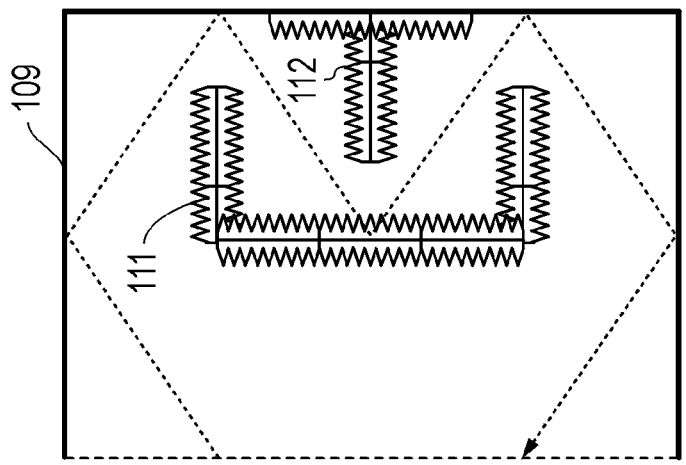
FIG. 13 depicts separate anechoic chambers connected by corridors comprising reflecting walls and absorbing baffles.
Figure 13:
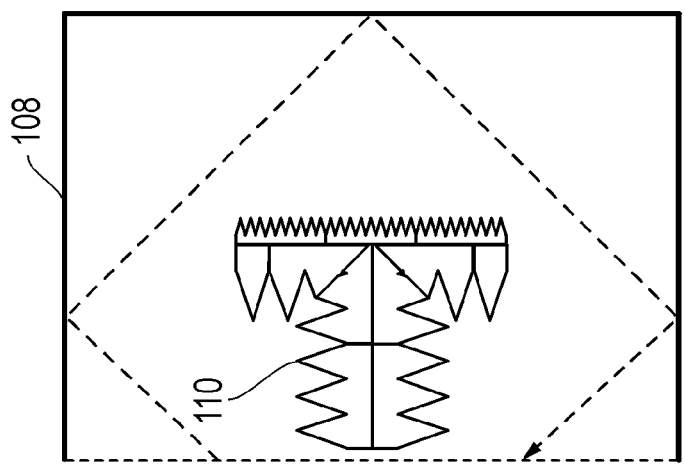
Figure 13:
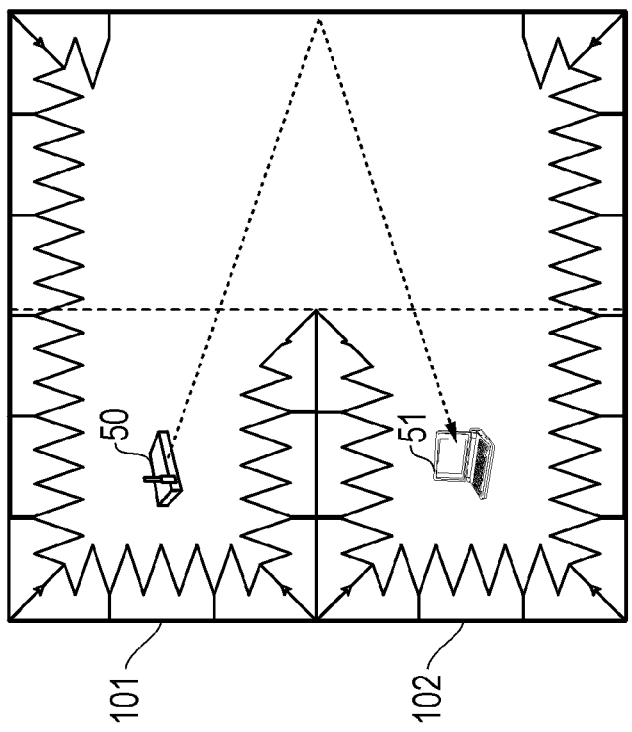

FIG. 13 shows two separate anechoic chambers 101 and 102 connected through propagation path corridors 107, 108 and 109 constructed of suitable RF reflecting material. Absorbing baffles 110, 111, and 112 are placed as needed to block unwanted paths and to select desired paths. Again, these different propagation paths may be stacked in parallel to provide multiple propagation paths simultaneously.

Figure 14:
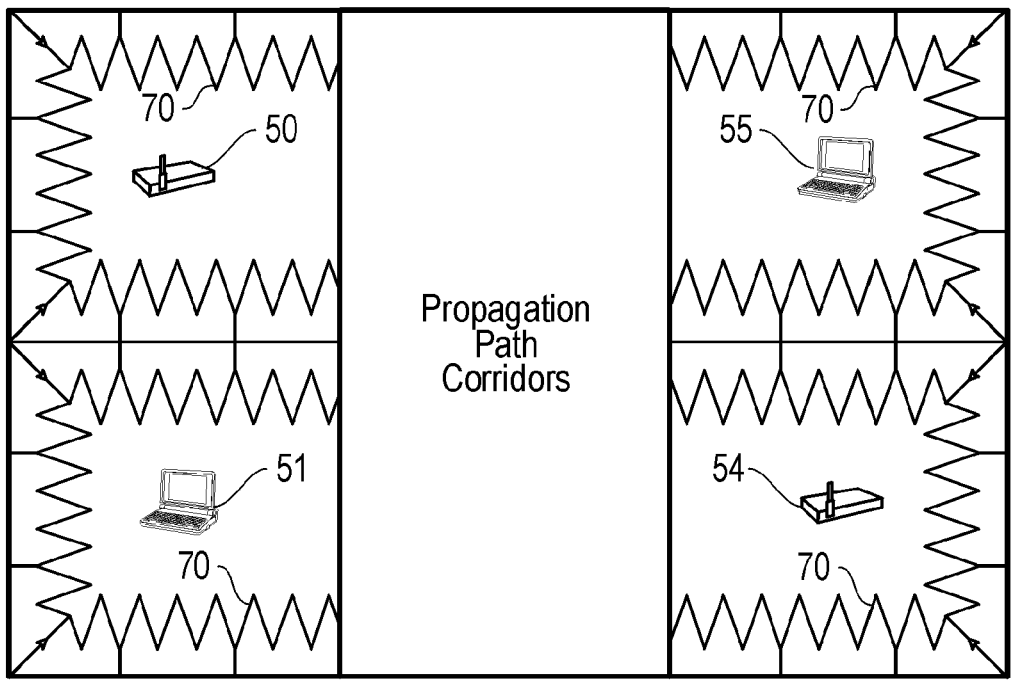
FIG. 14 depicts more than two separate anechoic chambers connected by propagation path corridors.
Figure 15:
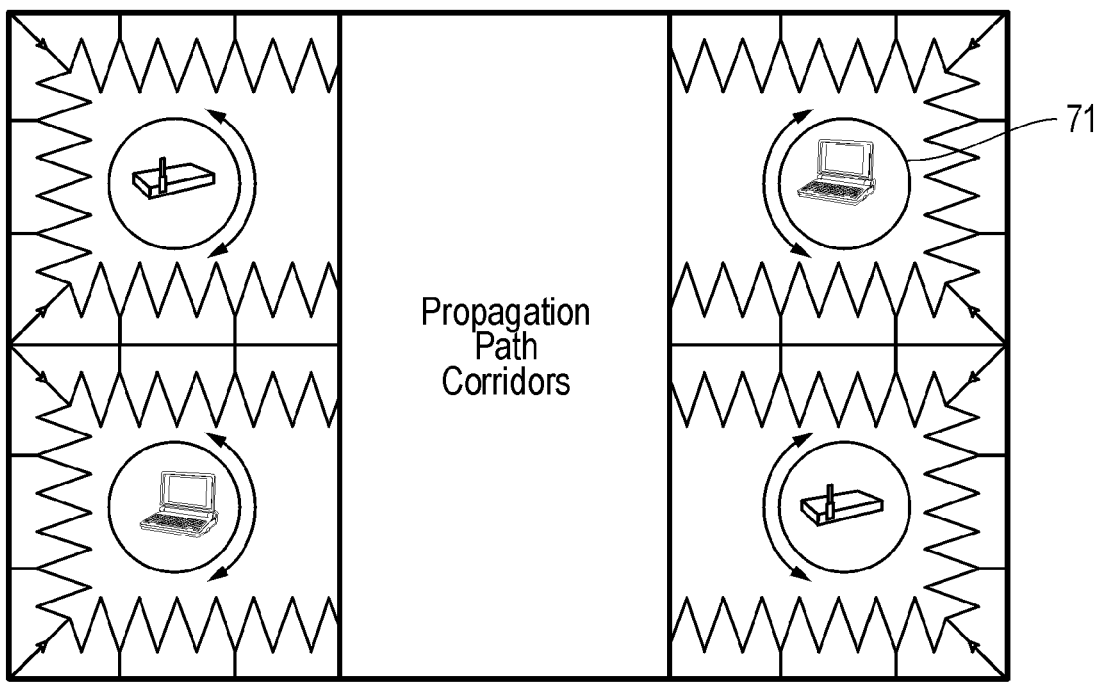
FIG. 15 depicts multiple anechoic chambers connected by propagation path corridors with positioners to change the orientation of devices under test (DUTs).

FIG. 14 show that more than two separated anechoic chambers with absorbers 70 can be connected through propagation corridors as described above to test more than two devices or sets of devices simultaneously in the presence of multiple paths between them. Accordingly, in the example of FIG. 14, one anechoic chamber contains a transmitting device 50; another anechoic chamber contains a receiving device 51; another anechoic chamber contains a transmitting device 54; and another anechoic chamber contains a receiving device 55. FIG. 15 shows multiple anechoic chambers connected by propagation path corridors, with devices under test mounted upon positioners 71 such as turntables that rotate. Movement of the positioners allows for statistical variation of the fields.

Figure 16:
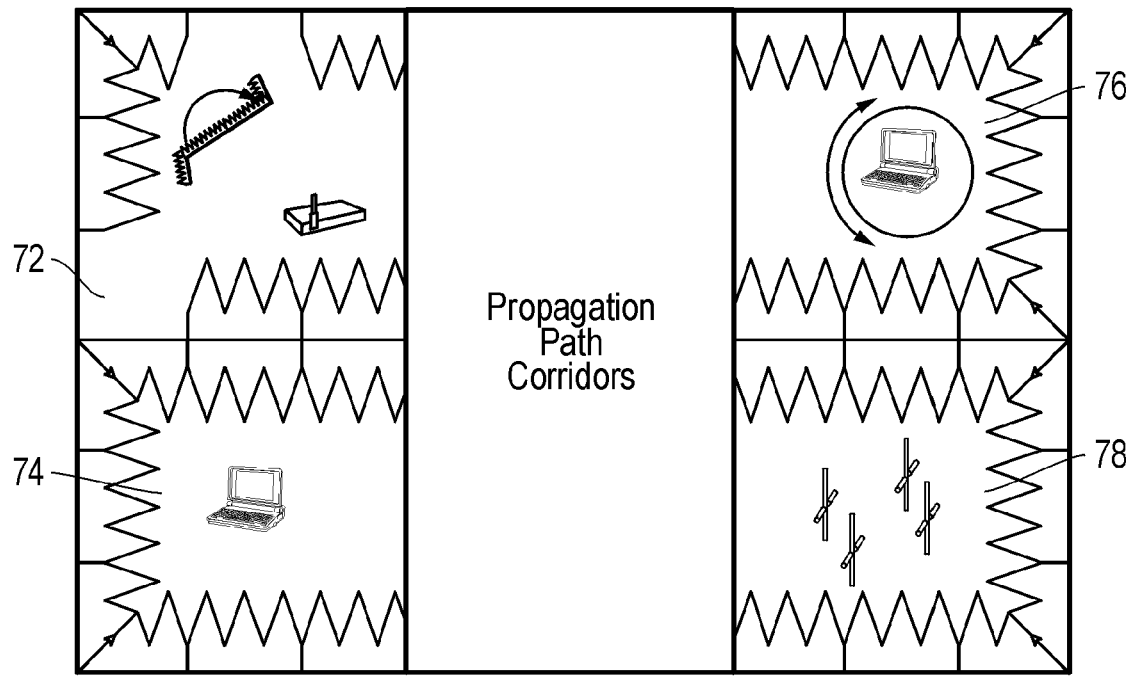
FIG. 16 depicts that any number of combinations of elements may be employed for multi-corridor testing.

FIG. 16 shows anechoic chambers connected by propagation corridors with different types of elements in each chamber. Thus, one chamber 72 is of the type shown in FIG. 10. Another chamber 74 is of the type shown in FIG. 7 and contains a stationary DUT. Another chamber 76 contains a DUT on a positioner. Another chamber 78 shows MIMO antennas that are connected to external test equipment. Thus any combination of chamber types and elements may be employed using propagation path corridors to connect the chambers.

Figure 17:
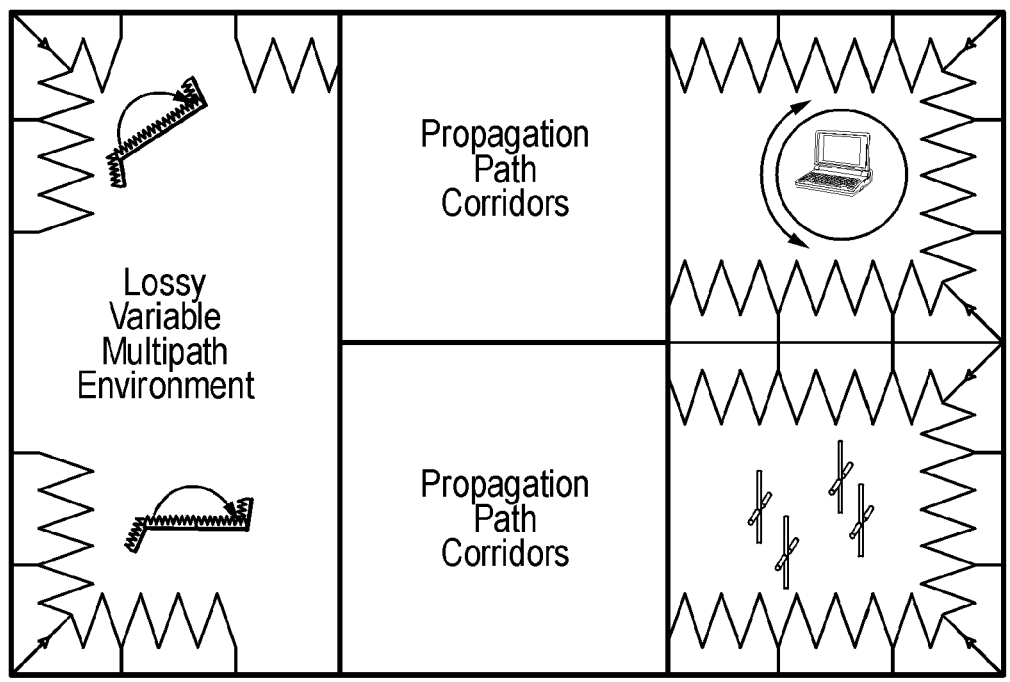
FIG. 17 depicts a lossy variable path chamber in connection with anechoic chambers through propagation path corridors.
Figure 18:
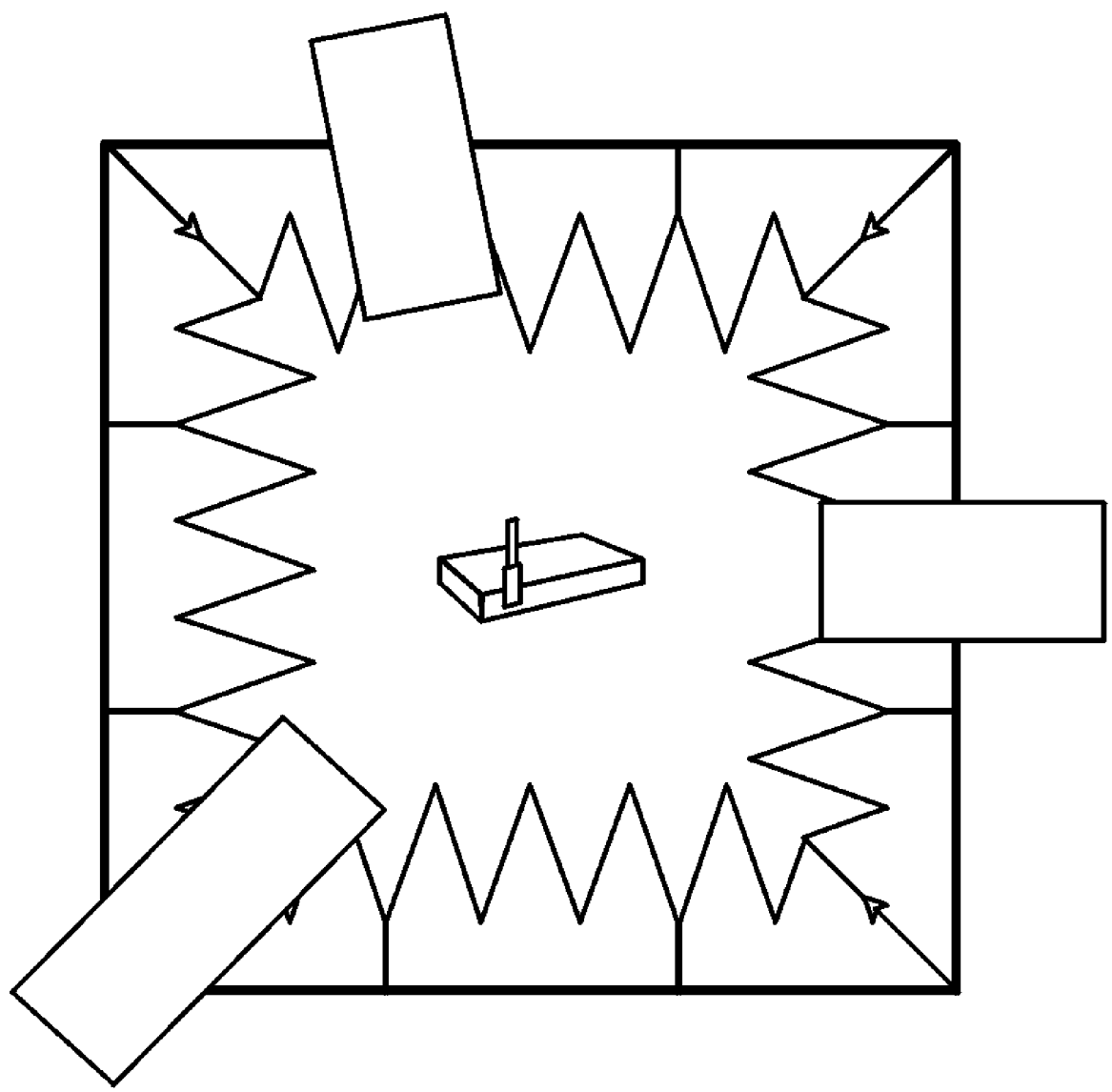
FIG. 18 depicts propagation path corridors situated at angles in an anechoic chamber.
Figure 19:
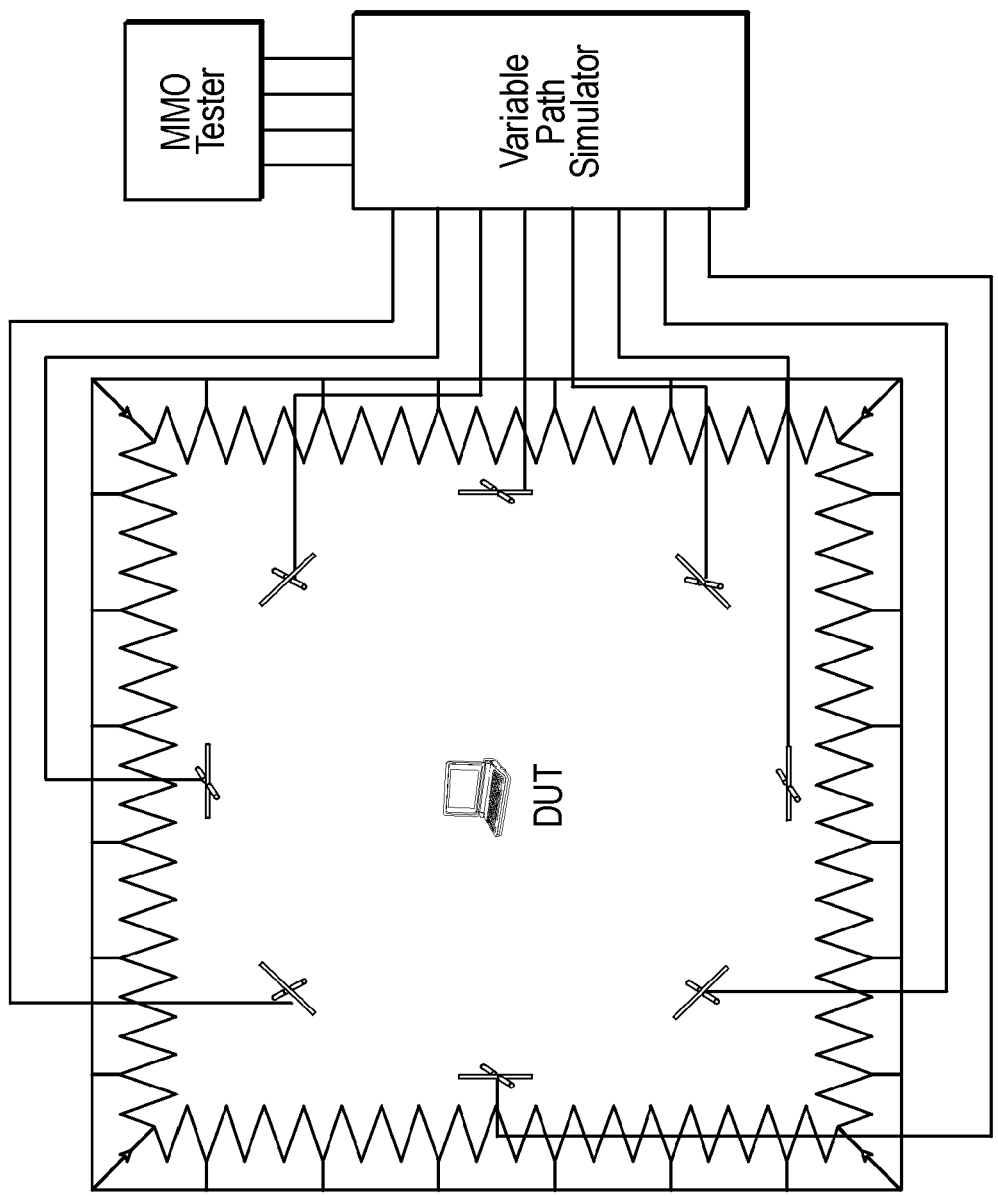
FIG. 19 depicts an alternative test using multiple antennas with a variable path simulator.

FIG. 17 shows an adjustable environment such a lossy reverberation chamber with paddles connected by propagation path corridors to two separate anechoic chambers containing a DUT and MIMO antennas. FIG. 18 shows propagation path corridors arranged around the perimeter of a chamber so that different delayed signals arrive from different directions. FIG. 19 shows an array of antennas surrounding a DUT in a lossy chamber. Each antenna is connected to a variable path simulator to simulate different propagation paths.

Thus, some embodiments comprise a test apparatus for over-the-air testing of wireless devices. One embodiment comprises a plurality of anechoic chambers, at least one chamber to contain a device under test; and at least one propagation path corridor connecting two or more chambers. In some embodiments, at least one propagation path corridor is a section of waveguide. In some embodiments, at least one propagation path corridor comprises at least one absorbing baffle to selectively pass a propagation path. In some embodiments, a plurality of propagation path corridors provide a plurality of propagation paths of different lengths. In some embodiments at least one chamber comprises a moveable positioner on which a device under test can be mounted. In some embodiments, at least one anechoic chamber contains one or more antennas connected to external equipment. In some embodiments, at least one anechoic chamber exhibits at least one wall that is only partially covered by absorbers. In some embodiments, at least one anechoic chamber comprises at least one positionable stir paddle. Another embodiment comprises: an apparatus for over the air testing of wireless devices, comprising an anechoic chamber; and an array of antennas connected to a variable path simulator. In some embodiments, the apparatus further comprises at least a second anechoic chamber connected through a propagation corridor to the anechoic chamber containing the antennas.

Thus, there are a wide range of alternatives to developing multipath behaviors in a test environment suitable for 802.11n MIMO over-the-air testing. A controlled test environment is preferable to unrepeatable real world environments. Existing technologies such as shielded rooms or anechoic chambers in their typical configurations do not provide an ideal solution. Thus, the new concepts provided herein provide more suitable solutions for over-the-air testing of these systems.

The present invention and some of its advantages have been described in detail for some embodiments. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A test apparatus for testing a wireless device in a multipath environment, the test apparatus comprising:
    a first partially lined reverberation chamber comprising surfaces that are lined with absorber and comprising reflecting surfaces that are not lined with absorber;
    within the first partially lined reverberation chamber, at least a first rotatable obstacle that when rotated varies a multi-path effect of the test apparatus;
    a second chamber coupled to the first partially lined reverberation chamber by a plurality of propagation path corridors; and
    a third chamber coupled to the first partially lined reverberation chamber by a plurality of propagation path corridors.

2. The test apparatus of claim 1, wherein the rotatable obstacle is at least partially reflecting.

3. The test apparatus of claim 1, wherein the rotatable obstacle is at least partially covered with absorber.

4. The test apparatus of claim 1, further comprising a second rotatable obstacle that when rotated varies a multi-path effect of the chamber.

5. The test apparatus of claim 1, wherein the second chamber exhibits a rotating absorbing baffle.

6. Test apparatus of claim 1, wherein the second chamber is adapted to hold a device under test and the third chamber is adapted to hold one or more antennas.

7. A method of testing a wireless device in a multipath environment, the method comprising:
    providing a first partially lined reverberation chamber that includes surfaces that are lined with absorber and reflecting surfaces that are not fined with absorber;
    providing a rotatable obstacle within the first partially aligned reverberation chamber that when rotated varies the variable multipath environment to simulate a variable multipath environment;
    providing a second chamber coupled to the first partially lined reverberation chamber by a plurality of propagation path corridors; and
    providing a third chamber coupled to the first partially lined reverberation chamber by a plurality of propagation path corridors.

8. The method of claim 7, further comprising selectively lining, between tests, surfaces of the first partially line reverberation chamber to achieve a desired multipath effect.

9. The method of claim 8, further comprising rotating the rotatable obstacle to achieve a desired multipath effect.

10. The method of claim 7, further comprising rotating the rotatable obstacle to achieve a desired multipath effect.

11. The method of claim 7, further comprising providing an additional one or more rotating obstacles.

12. The method of claim 11, wherein at least one of the rotating obstacles exhibits a reflecting surface.

13. The method of claim 7, wherein the rotating obstacle exhibits a corner.

14. A test structure, comprising:
    a first partially lined reverberation chamber having at least one rotatable obstacle;
    a second chamber adapted to hold a device under test, the second chamber coupled to the first partially lined reverberation chamber by a first set of propagation path corridors; and
    a third chamber adapted to hold at least one antenna, the third chamber coupled to the first partially lined reverberation chamber by a second set of propagation path corridors.

15. The test structure of claim 14, wherein the first partially lined reverberation chamber has a plurality of rotatable obstacles.

16. The test structure of claim 15, wherein a plurality of rotatable obstacles are positioned to achieve a desired multi-path effect.

17. The test structure of claim 14, wherein the first set of propagation path corridors is a plurality of waveguides of different electrical lengths.

18. The test structure of claim 14, wherein the second chamber is a partially lined reverberation chamber.

19. The test structure of claim 14, wherein the third chamber is a partially lined reverberation chamber.

* * * * *